US012787769B2

(12) United States Patent
Kazem et al.

(10) Patent No.: US 12,787,769 B2
(45) Date of Patent: Nov. 3, 2026

(54) METHOD OF MANUFACTURE OF A THERMAL INTERFACE MATERIAL, A THERMAL INTERFACE MATERIAL FORMED THEREFROM, AND AN INTEGRATED CIRCUIT FORMED THEREFROM

(71) Applicant: Arieca Inc., Pittsburgh, PA (US)

(72) Inventors: Navid Kazem, Pittsburgh, PA (US); Jeffrey Gelorme, Burlington, CT (US); Keyton D. Feller, Pittsburgh, PA (US); Allyssa Kerr, Pittsburgh, PA (US)

(73) Assignee: ARIECA INC., Pittsburgh, PA (US)

( * ) Notice: Subject to any disclaimer, the term of this patent is extended or adjusted under 35 U.S.C. 154(b) by 444 days.

(21) Appl. No.: 18/527,697

(22) Filed: Dec. 4, 2023

(65) Prior Publication Data

US 2024/0243033 A1 Jul. 18, 2024

Related U.S. Application Data

(60) Provisional application No. 63/479,879, filed on Jan. 13, 2023.

(51) Int. Cl.
*H10W 40/25* (2026.01)
*C08J 3/11* (2006.01)
(Continued)

(52) U.S. Cl.
CPC ............. *H10W 40/251* (2026.01); *C08J 3/11* (2013.01); *C08J 3/212* (2013.01); *C08K 3/08* (2013.01);
(Continued)

(58) Field of Classification Search
None
See application file for complete search history.

(56) References Cited

U.S. PATENT DOCUMENTS 5,113,565 A 5/1992 Cipolla et al.
5,445,308 A 8/1995 Nelson et al.
(Continued)

FOREIGN PATENT DOCUMENTS

CN 1801482 A 7/2006
CN 1872942 A 12/2006
(Continued)

OTHER PUBLICATIONS

VytaFlex™ Series, Material Safety Data Sheet, Feb. 1, 2008, MSDS No. 618, 8 pages.
(Continued)

*Primary Examiner* — Anthony Ho
(74) *Attorney, Agent, or Firm* — K&L Gates LLP

(57) ABSTRACT

A method of manufacture of a thermal interface material, a thermal interface material formed therefrom, and an integrated circuit formed therefrom are provided. The method includes distilling a first polymer component to form a distilled polymer component. The first polymer component includes a first concentration of volatile organic compounds and the distilled polymer component includes a second concentration of volatile organic compounds. The second concentration is at least 0.1% by weight less than the first concentration. The method comprises mixing the distilled polymer component with liquid metal to form a thermal interface material such that liquid metal droplets are dispersed throughout the distilled polymer component.

36 Claims, 1 Drawing Sheet

(51) Int. Cl.

| | |
|---|---|
| ***C08J 3/21*** | (2006.01) |
| ***C08K 3/08*** | (2006.01) |
| ***C08K 5/54*** | (2006.01) |
| *H10W 72/00* | (2026.01) |
| *H10W 72/30* | (2026.01) |

(52) U.S. Cl.

CPC ............. *C08K 5/54* (2013.01); *C08J 2351/00* (2013.01); *H10W 72/07338* (2026.01); *H10W 72/325* (2026.01); *H10W 72/352* (2026.01); *H10W 72/354* (2026.01)

(56) References Cited

U.S. PATENT DOCUMENTS

| | | | |
|---|---|---|---|
| 6,248,151 | B1 | 6/2001 | Horine |
| 6,797,758 | B2 | 9/2004 | Misra et al. |
| 7,141,273 | B2 | 11/2006 | Endo et al. |
| 7,726,545 | B2 | 6/2010 | Ichiryu et al. |
| 7,799,607 | B2 | 9/2010 | Karashima et al. |
| 8,802,763 | B2 | 8/2014 | Yamada et al. |
| 9,308,571 | B2 | 4/2016 | Kempers et al. |
| 10,199,302 | B1 | 2/2019 | Sanchez et al. |
| 10,777,483 | B1 | 9/2020 | Kazem et al. |
| 11,021,607 | B2 | 6/2021 | Bhagwagar et al. |
| 11,335,622 | B2 | 5/2022 | Kazem et al. |
| 12,027,442 | B1 | 7/2024 | Gelorme et al. |
| 12,107,031 | B2 | 10/2024 | Akiba et al. |
| 12,588,499 | B2 | 3/2026 | Eid et al. |
| 2003/0027910 | A1 | 2/2003 | Misra et al. |
| 2003/0052156 | A1 | 3/2003 | Kim et al. |
| 2004/0079548 | A1 | 4/2004 | Berghoff et al. |
| 2004/0124526 | A1 | 7/2004 | Matayabas, Jr. et al. |
| 2005/0084691 | A1 | 4/2005 | Endo et al. |
| 2005/0228097 | A1 | 10/2005 | Zhong |
| 2006/0131738 | A1 | 6/2006 | Furman et al. |
| 2007/0042533 | A1 | 2/2007 | Endo et al. |
| 2007/0117270 | A1 | 5/2007 | Renavikar et al. |
| 2007/0131055 | A1 | 6/2007 | Cheng et al. |
| 2007/0238282 | A1 | 10/2007 | Furman et al. |
| 2008/0023665 | A1 | 1/2008 | Weiser et al. |
| 2008/0291634 | A1 | 11/2008 | Weiser et al. |
| 2011/0024101 | A1 | 2/2011 | Han et al. |
| 2011/0038124 | A1 | 2/2011 | Burnham et al. |
| 2014/0264820 | A1 | 9/2014 | Hu et al. |
| 2014/0374897 | A1 | 12/2014 | Zhao et al. |
| 2015/0101785 | A1 | 4/2015 | Ho et al. |
| 2016/0219751 | A1 | 7/2016 | Kempers |
| 2017/0117208 | A1 | 4/2017 | Kasztelan et al. |
| 2017/0179002 | A1 | 6/2017 | Chainer et al. |
| 2017/0200667 | A1 | 7/2017 | John et al. |
| 2017/0218167 | A1 | 8/2017 | Majidi et al. |
| 2017/0249751 | A1 | 8/2017 | Indelman |
| 2018/0090411 | A1 | 3/2018 | Cetegen et al. |
| 2018/0269128 | A1 | 9/2018 | Limaye et al. |
| 2018/0323130 | A1 | 11/2018 | Liu et al. |
| 2018/0374714 | A1 | 12/2018 | Stathakis et al. |
| 2019/0172726 | A1 | 6/2019 | Berntson et al. |
| 2019/0181069 | A1 | 6/2019 | Rykaczewski et al. |
| 2019/0221495 | A1 | 7/2019 | Divakar et al. |
| 2019/0221498 | A1 | 7/2019 | Wu et al. |
| 2019/0267306 | A1 | 8/2019 | Raravikar et al. |
| 2019/0348345 | A1 | 11/2019 | Parida et al. |
| 2019/0371700 | A1 | 12/2019 | Yeh |
| 2020/0168523 | A1 | 5/2020 | Huang et al. |
| 2020/0219786 | A1 | 7/2020 | Hung et al. |
| 2020/0227338 | A1 | 7/2020 | Gong |
| 2020/0227339 | A1 | 7/2020 | Schwab et al. |
| 2020/0263285 | A1 | 8/2020 | Stowell et al. |
| 2020/0328007 | A1 | 10/2020 | Majidi et al. |
| 2020/0362218 | A1 | 11/2020 | Kazem et al. |
| 2021/0125896 | A1 | 4/2021 | Arrington et al. |
| 2021/0126246 | A1 | 4/2021 | Gazda et al. |
| 2021/0233832 | A1 | 7/2021 | Uppal et al. |
| 2021/0249375 | A1 | 8/2021 | Eid |
| 2021/0272873 | A1 | 9/2021 | Kazem et al. |
| 2022/0199489 | A1 | 6/2022 | Arrington et al. |
| 2022/0380652 | A1 | 12/2022 | Maruyama et al. |
| 2023/0034217 | A1 | 2/2023 | Mayukh et al. |
| 2024/0199817 | A1 | 6/2024 | Yamada et al. |
| 2024/0203754 | A1 | 6/2024 | Kazem et al. |
| 2024/0213115 | A1 | 6/2024 | Kazem et al. |
| 2025/0037294 | A1 | 1/2025 | Russell et al. |
| 2025/0069987 | A1 | 2/2025 | Kazem et al. |
| 2025/0112127 | A1 | 4/2025 | Jun et al. |
| 2025/0197596 | A1 | 6/2025 | Kazem et al. |

FOREIGN PATENT DOCUMENTS

| | | | |
|---|---|---|---|
| CN | 1923944 | B | 6/2012 |
| CN | 104031600 | A | 9/2014 |
| CN | 104031600 | B | 3/2016 |
| CN | 103665770 | B | 7/2016 |
| CN | 107393627 | A | 11/2017 |
| CN | 107452436 | A | 12/2017 |
| CN | 107501953 | A | 12/2017 |
| CN | 109135685 | A | 1/2019 |
| CN | 107393627 | B | 11/2019 |
| CN | 110564157 | A | 12/2019 |
| EP | 0696630 | A2 | 2/1996 |
| EP | 0696630 | A3 | 5/1997 |
| EP | 1300883 | A2 | 4/2003 |
| EP | 3872853 | A1 | 9/2021 |
| EP | 3923317 | A1 | 12/2021 |
| JP | 2000-232190 | A | 8/2000 |
| JP | 2003-234586 | A | 8/2003 |
| JP | 2004-238646 | A | 8/2004 |
| JP | 2005-530887 | A | 10/2005 |
| JP | 2005-342559 | A | 12/2005 |
| JP | 2008-306202 | A | 12/2008 |
| JP | 2013-10862 | A | 1/2013 |
| JP | 2014-24958 | A | 2/2014 |
| JP | 5565758 | B2 | 6/2014 |
| JP | 6042307 | B2 | 11/2016 |
| KR | 20190016856 | A1 | 2/2019 |
| KR | 102176691 | B1 | 11/2020 |
| KR | 20220043762 | A | 4/2022 |
| TW | 200635992 | A | 10/2006 |
| WO | 02/069685 | A1 | 9/2002 |
| WO | 2016/004565 | A1 | 1/2016 |
| WO | 2017165608 | A1 | 9/2017 |
| WO | 2019/136252 | A1 | 7/2019 |
| WO | 2020129555 | A1 | 6/2020 |
| WO | 20220204689 | A1 | 9/2022 |
| WO | 2023081478 | A1 | 5/2023 |
| WO | 2024084897 | A1 | 4/2024 |

OTHER PUBLICATIONS

Fassler, Andrew L., Application of Liquid-Metal GaIn Alloys to Soft-matter Capacitance and Related Stretchable Electronics Submitted in partial fulfillment of the requirements for the degree of Doctor of Philosophy in Mechanical Engineering, Carnegie Mellon University, Pittsburgh, PA, Jan. 2016, 154 pages.

Hutter et al., Formation of Spherical and Non-Spherical Eutectic Gallium-Indium Liquid-Metal Microdroplets in Microfluidic Channels at Room Temperature, Advanced Functional Materials, 2012, 8 pages.

Thelen et al., A study of the production and reversible stability of EGaIn liquid metal microspheres using flow focusing, Lab on a Chip, 2012, 12, pp. 3961-3961.

Wang et al., A Highly Stretchable Liquid Metal Polymer as Reversible Transitional Insulator and Conductor, Advanced Materials, vol. 31, No. 23, Apr. 11, 2019, 10 pages.

International Search Report and Written Opinion of the International Searching Authority for International Application No. PCT/US2022/071276 mailed Jun. 23, 2022.

International Search Report and Written Opinion of the International Searching Authority for International Application No. PCT/US2023/062459 mailed Jun. 23, 2023.

International Search Report and Written Opinion of the International Searching Authority for International Application No. PCT/US2024/019634 mailed Jul. 3, 2024.

(56) References Cited

OTHER PUBLICATIONS

International Search Report and Written Opinion of the International Searching Authority for International Application No. PCT/US2024/018810 mailed May 27, 2024.
International Search Report and Written Opinion of the International Searching Authority for International Application No. PCT/US2024/037294 mailed Sep. 19, 2024.
International Search Report and Written Opinion of the International Searching Authority for International Application No. PCT/US2024/047946 mailed Jan. 14, 2025.
International Search Report and Written Opinion of the International Searching Authority for International Application No. PCT/US2023/083946 mailed May 21, 2024.

METHOD OF MANUFACTURE OF A THERMAL INTERFACE MATERIAL, A THERMAL INTERFACE MATERIAL FORMED THEREFROM, AND AN INTEGRATED CIRCUIT FORMED THEREFROM

PRIORITY CLAIM

The subject application claims priority to U.S. provisional patent application Ser. No. 63/479,879, filed Jan. 13, 2023, having the same title and inventors as indicated above, and which is incorporated herein by reference it is entirety.

FIELD

The present disclosure relates to a method of manufacture of a thermal interface material, a thermal interface material formed therefrom, and an integrated circuit formed therefrom.

BACKGROUND

A thermal interface material (TIM) can be used to thermally connect two or more layers together. For example, TIMs are often used in CPU packages to thermally connect the integrated heat spreader (IHS) of a CPU package to a heat sink. There are various types of methods to manufacture TIMs that may be used. However, current methods of manufacture of TIMs present challenges.

SUMMARY

In one general aspect, the present disclosure is directed towards a method of manufacture of a thermal interface material. The method comprises distilling a first polymer component to form a distilled polymer component. In various examples, the distilling can comprise short path vacuum distillation and/or rotary distillation. The first polymer component comprises a first concentration of volatile organic compounds and the distilled polymer component comprises a second concentration of volatile organic compounds. The second concentration is at least 0.1% by weight less than the first concentration, such as, for example, at least 0.5% by weight less, at least 1.0% by weight less, at least 1.5% by weight less, at least 2% by weight less, at least 2.5% by weight less, at least 3% by weight less, or at least 4% by weight less than the first concentration. The method comprises mixing the distilled polymer component with liquid metal to form a thermal interface material such that liquid metal droplets are dispersed throughout the distilled polymer component. The mixing can comprise centrifugal mixing and/or shear mixing. In various examples, the liquid metal droplets comprise at least one of gallium, a gallium alloy, indium, an indium alloy, tin, a tin alloy, mercury, and a mercury alloy. The first polymer component can comprise a polymeric binder, a thermosetting polymer, and/or a thermoplastic polymer. In various examples, the first polymer component comprises a cross-linking agent and the method further comprises mixing the distilled polymer component with a second polymer component comprising a monomer. The thermal interface material can optionally comprise rigid particles, a catalyst, and/or a coupling agent.

In another general aspect, the present disclosure is directed towards a thermal interface material formed therefrom.

In yet another general aspect, the present disclosure is directed towards an integrated circuit formed therefrom.

The present invention can provide both a low contact resistance at the material interfaces and a low thermal resistance through the TIM. The low contact resistance and low thermal resistance can be enabled by reduced void formation in the TIM after curing. These and other benefits realizable from various embodiments of the present invention will be apparent from the description that follows.

BRIEF DESCRIPTION OF THE DRAWINGS

The features and advantages of various examples of the present invention, and the manner of attaining them, will become more apparent, and the examples will be better understood by reference to the following description of examples taken in conjunction with the accompanying drawing, wherein.

Corresponding reference characters indicate corresponding parts throughout the several views. The exemplifications set out herein illustrate certain examples, in one form, and such exemplifications are not to be construed as limiting the scope of the examples in any manner.

DETAILED DESCRIPTION

Figure 1:
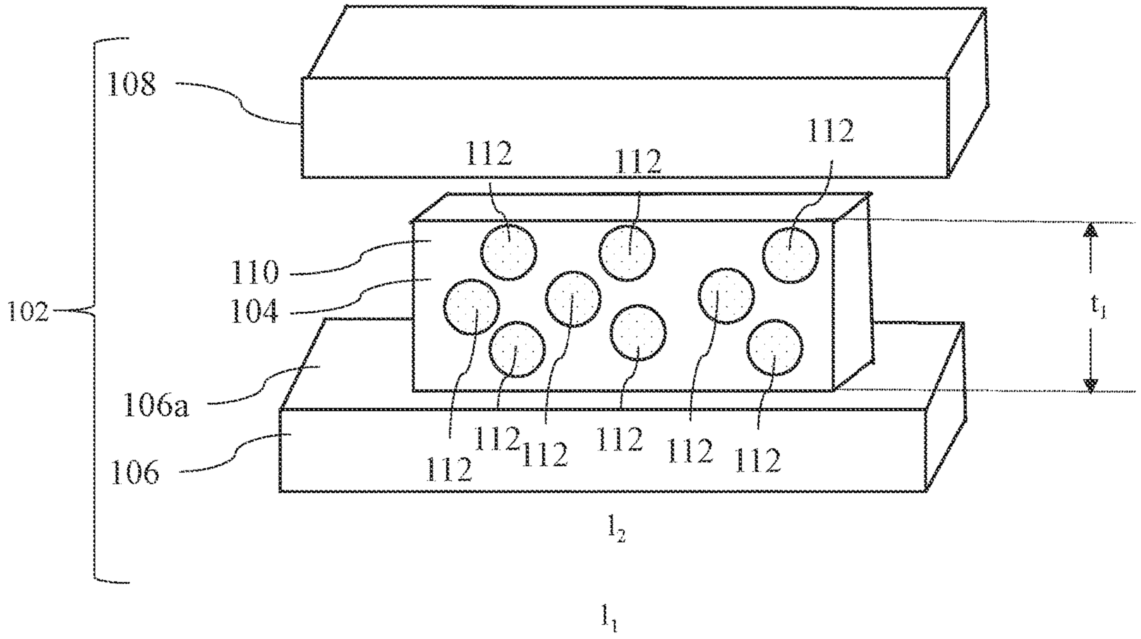
FIG. 1 is a perspective view of a circuit assembly according to the present disclosure after deposition of the thermal interface material.

Certain exemplary aspects of the present invention will now be described to provide an overall understanding of the principles of the composition, function, manufacture, and use of the compositions and methods disclosed herein. An example or examples of these aspects are illustrated in the accompanying drawing. Those of ordinary skill in the art will understand that the compositions, articles, and methods specifically described herein and illustrated in the accompanying drawing are non-limiting exemplary aspects and that the scope of the various examples of the present invention is defined solely by the claims. The features illustrated or described in connection with one exemplary aspect may be combined with the features of other aspects. Such modifications and variations are intended to be included within the scope of the present invention.

Applying a thermal interface material (TIM) to a circuit assembly such that the TIM is between an integrated heat spreader (IHS) and a heat sink can require balancing the thermal resistance through the TIM and the contact resistance at the material interfaces. For example, a polymeric material may have a low contact resistance at the material interfaces but a high thermal resistance through the material. A solid metal may have a low thermal resistance through the material but a high contact resistance at the material interfaces. Additionally, some solid materials (polymeric or metal) may require a large pressure during installation to achieve a desired contact resistance. Further, when utilizing a TIM with liquid metal droplets and polymer, the current inventors have determined there are challenges with achieving a reduced amount and/or size of voids in the TIM after curing, which can affect the effective thermal conductivity through the TIM.

For example, the present inventors observed if a significant amount of volatile organic compounds (VOCs) are present in the TIM, significant void formation can occur in the TIM after curing. Thus, the present inventors provide, in various examples, a method of manufacture of a TIM, a TIM formed therefrom, and a circuit assembly formed therefrom. The method comprises distilling a first polymer component to form a distilled polymer component and mixing the distilled polymer component with liquid metal to form a TIM such that liquid metal droplets are dispersed throughout the distilled polymer component. Distilling the first polymer component can reduce void formation in the TIM after curing.

The distilling can comprise separating VOCs from the first polymer component, thereby forming the distilled polymer component and a VOC component. The distilling can be a continuous process or a batch process, depending on the desired application. The distilling can comprise heating the first polymer component, subjecting the first polymer component to vacuum pressure, and/or other suitable distillation technique. For example, the distilling can cause the VOCs to vaporize and/or boil such that the VOCs can be removed from the first polymer component by phase separation.

The VOC component can comprise water, organic carbon compounds (e.g., cyclic oligomers), and/or low molecular weight compounds (e.g., low molecular weight polydimethylsiloxane). For example, the cyclic oligomers can comprise octamethylcyclotetrasiloxane, decamethylcyclopentasiloxane, and/or odecamethylcyclohexasiloxane. The low molecular weight compounds can comprise a molecular weight that is 10% or less of the starting polymer. The VOC component can be sold, recycled, disposed of, and/or used for another application.

The distilling can comprise heating the first polymer component to a temperature of at least 100 degrees Celsius, such as, for example, at least 110 degrees Celsius, at least 120 degrees Celsius, or at least 130 degrees Celsius. The distilling can comprise heating the first polymer component to a temperature of no greater than 250 degrees Celsius, such as, for example, no greater than 200 degrees Celsius, no greater than 150 degrees Celsius, no greater than 140 degrees Celsius, no greater than 130 degrees Celsius, or no greater than 120 degrees Celsius. In various examples, the distilling can comprise heating the first polymer component to a temperature in a range of 100 degrees Celsius to 250 degrees Celsius, such as, for example, 100 degrees Celsius to 150 degrees Celsius, 100 degrees Celsius to 130 degrees Celsius, or 110 degrees Celsius to 130 degrees Celsius.

The distilling can comprise subjecting the first polymer component to a vacuum pressure such that the vapor pressure of the VOCs can increase leading to separation of VOCs component and the distilled polymer component. The distilling can comprise subjecting the first polymer component to a pressure of 500 mbar absolute or less, such as, for example, 100 mbar absolute or less, 75 mbar absolute or less, 50 mbar absolute or less, 25 mbar absolute or less, 20 mbar absolute or less, 10 mbar absolute or less, or 5 mbar absolute or less. The distilling can comprise subjecting the first polymer component to a pressure of 0.001 mbar absolute or greater, such as, for example, 0.01 mbar absolute or greater or 0.1 mbar absolute or greater. The distilling can comprise subjecting the first polymer component to a pressure in a range of 0.001 mbar absolute to 500 mbar absolute, such as, for example, 0.001 mbar absolute to 100 mbar absolute or 0.001 mbar absolute to 50 mbar absolute.

The distilling can comprise at least one of short path vacuum distillation and a rotary distillation. The distilling can comprise short path vacuum distillation including a heated condenser. In various examples, the distilling can comprise a vacuum oven.

The first polymer component can comprise a first concentration of VOCs and the distilled polymer component can comprises a second concentration of VOCs. The second concentration can be at least 0.1% by weight less than the first concentration, such as, for example, at least 0.5% by weight less, at least 1.0% by weight less, at least 1.5% by weight less, at least 2% by weight less, at least 2.5% by weight less, at least 3% by weight less, or at least 4% by weight less than the first concentration. In various examples, the first concentration can be in a range of 2% by weight to 5% by weight based on a total weight of the first polymer component. The second concentration can be no greater than 1% by weight based on a total weight of the distilled polymer component, such as for example, no greater than 0.5% by weight, no greater than 0.3% by weight, no greater than 0.2% by weight, no greater than 0.1% by weight, or no greater than 0.05% by weight, all based on the total weight of the distilled polymer component.

In various examples, the distilled polymer component can comprise a weight loss of 0.5% by weight or less as measured using a thermogravimetric analyzer at 175 degrees Celsius, with a one hour hold time, with a 30 degrees Celsius per minute temperature ramp under a nitrogen gas purge, such as, for example, 0.4% by weight or less, 0.3% by weight or less, 0.2% by weight or less, or 0.1% by weight or less, all as measured using a thermogravimetric analyzer at 175 degrees Celsius, with a one hour hold time, with a 30 degrees Celsius per minute temperature ramp under a nitrogen gas purge.

The first polymer component comprises a first average molecular weight and the distilled polymer component comprises a second average molecular weight, both as measured by gel permeation chromatography. The second average molecular weight can be greater than the first average molecular weight due to the removal of the VOCs. The first polymer can comprise an initial viscosity and the distilled polymer can comprise a first viscosity. The first viscosity can be greater than the initial viscosity, such as, for example, at least 1.5 times greater, at least two times greater, at least three times greater, at least four times greater, at least five times greater, or at least 10 times greater than the initial viscosity.

The method comprises mixing the distilled polymer component with liquid metal to form the TIM such that liquid metal droplets are substantially dispersed throughout the distilled polymer component (e.g., an emulsion of liquid metal droplets and the distilled polymer component). For example, the distilled polymer component and the bulk liquid metal can be mixed together by shear mixing, centrifugal mixing, shaking in a container, a mortar and pestle, and sonication. In various examples, the distilled polymer component and the bulk liquid metal can be mixed together by shear mixing and/or centrifugal mixing. More details about exemplary ways to form the liquid metal droplets dispersed throughout the distilled polymer component are described in (1) published PCT WO/2019/136252, entitled "Method of Synthesizing a Thermally Conductive and Stretchable Polymer Composite", (2) published U.S. application US 2017/0218167, entitled "Polymer Composite with Liquid Phase Metal Inclusions," (3) U.S. Pat. No. 10,777,483, entitled "Method, apparatus, and assembly for thermally connecting layers", (4) U.S. Provisional Patent No. 63/268,134, entitled "Thermal interface material, an integrated circuit assembly, and a method for thermally connecting layers", and (5) published PCT WO 2022/204689 entitled "A method, apparatus, and assembly for thermally connecting layers with thermal interface materials comprising rigid particles", all of which are incorporated herein by reference in their entirety.

The distilled polymer component can be mixed with a second polymer component prior to mixing with the liquid metal, concurrently with mixing with the liquid metal, and/or after mixing with the liquid metal. The second polymer component can be distilled or not distilled prior to mixing with the distilled polymer component. The second polymer component can comprise the same polymer as the first polymer component or a different polymer than the first polymer component. For example, the first polymer component can comprise a cross-linking agent and the second polymer component can comprise a monomer.

The second polymer component can be used to adjust a physical property of the TIM. For example, the viscosity of the TIM can be changed by mixing the distilled polymer component with the second polymer component. In various examples, the distilled polymer component comprises a first viscosity as measured at 25 degrees Celsius and the second polymer component comprises a second viscosity as measured at 25 degrees Celsius, wherein the first viscosity is greater than the second viscosity, such as, for example, at least 10 cP greater, at least 50 cP greater, at least 100 cP greater, at least 1,000 cP greater, at least 10,000 cP greater, at least 50,000 cP greater, or at least 100,000 cP greater.

The first polymer component, the second polymer component, and the distilled polymer component, individually, can comprise one or at least two polymers and/or subcomponents thereof (e.g., a cross-linking agent). As used in this specification, the terms "polymer" and "polymeric" means prepolymers, oligomers, and both homopolymers and copolymers. As used in this specification, "prepolymer" means a polymer precursor capable of further reactions or polymerization by a reactive group or reactive groups to form a higher molecular mass or cross-linked state.

The polymer can be at least one of a polymeric binder, a thermosetting polymer, and a thermoplastic polymer. As used herein, the term "thermosetting" refers to polymers that "set" irreversibly upon curing or cross-linking, where the polymer chains of the polymeric components are joined together by covalent bonds, which is often induced, for example, by heat or radiation. In various examples, curing or a cross-linking reaction can be carried out under ambient conditions. Once cured or cross-linked, a thermosetting polymer may not flow upon the application of heat, may otherwise irreversibly increase in viscosity, and/or can be insoluble in conventional solvents. As used herein, the term "thermoplastic" refers to polymers that include polymeric components in which the constituent polymer chains are not joined (e.g., crosslinked) by covalent bonds and thereby can undergo liquid flow upon heating and are soluble in conventional solvents. In certain embodiments, the polymer can be elastomeric (e.g., rubbery, soft, stretchy) or rigid (e.g., glassy). For example, the polymer can be elastomeric.

Thermosetting polymers may include at least one of a cross-linking agent that may comprise, for example, aminoplasts, polyisocyanates (including blocked isocyanates), polyepoxides, beta-hydroxyalkylamides, polyacids, anhydrides, organometallic acid-functional materials, polyamines, polyvinyls, polysilicon hydrides, polyalcohols, polyacid chlorides, polyhalides, and polyamides. A polymer may have functional groups that are reactive with the cross-linking agent.

The polymer in the TIMs described herein may be selected from any of a variety of polymers well known in the art. For example, the thermosetting polymer may comprise at least one of an acrylic polymer, a polyester polymer, a polyurethane polymer, polybutadiene, a polyamide polymer, a polyether polymer, a polysiloxane polymer (e.g., poly(dimethylsiloxone)), a fluoropolymer, a polyisoprene polymer (e.g., rubber), and a copolymer thereof (e.g., styrene ethylene butylene styrene). The functional groups on a thermosetting polymer may be selected from any of a variety of reactive functional groups, including, for example, at least one of a carboxylic acid group, an amine group, an epoxide group, a hydroxyl group, a thiol group, a carbamate group, an amide group, a urea group, an isocyanate groups (including a blocked isocyanate group), a vinyl group, a silicon hydride group, an acid chloride group, an acrylate group, a halide group, and a mercaptan group. In various examples, the distilled polymer component can comprise a silane cross-linking agent and the second polymer component can comprise a silicone monomer.

The thermoplastic polymer can comprise at least one of propylene-ethylene co-polymer, styrene-butadiene-styrene, and styrene ethylene butylene styrene. The polymer can comprise a melting point of at least 100 degrees Celsius, such as, for example, at least 120 degrees Celsius, at least 150 degrees Celsius, or at least 200 degrees Celsius.

The liquid metal droplets for the TIM can comprise at least one of gallium, a gallium alloy, indium, an indium alloy, tin, a tin alloy, mercury, and a mercury alloy. The liquid metal droplets can comprise a melting point of no greater than 30 degrees Celsius, such as, for example, no greater than 25 degrees Celsius, no greater than 20 degrees Celsius, no greater than 15 degrees Celsius, no greater than 10 degrees Celsius, no greater than 5 degrees Celsius, no greater than 0 degrees Celsius, or no greater than-10 degrees Celsius. The liquid metal droplets can comprise a melting point of at least-40 degrees Celsius, such as, for example, at least-20 degrees Celsius, at least-19 degrees Celsius, at least-10 degrees Celsius, at least 0 degrees Celsius, at least 5 degrees Celsius, at least 10 degrees Celsius, at least 15 degrees Celsius, at least 20 degrees Celsius, or at least 25 degrees Celsius. The liquid metal droplets can comprise a melting point in a range of −40 degrees Celsius to 30 degrees Celsius, such as, for example, −20 degrees Celsius to 30 degrees Celsius, −19 degrees Celsius to 30 degrees Celsius, or −19 degrees Celsius to 25 degrees Celsius. The determination of the melting point can be made at a pressure of 1 atmosphere absolute. In certain embodiments, the TIM can comprise Gallium Indium Tin (Galinstan) and a melting point of −19 degrees Celsius.

The composition and/or mixing techniques can be chosen such that the viscosity is less than 850,000 cP (centipoise), such as, for example, less than 750,000 cP, less than 500,000 cp, less than 250,000 cP, 200,000 cP, less than 150,000 cP, less than 100,000 cP, less than 50,000 cP, less than 15,000 cP, less than 14,000 cP, less than 13,000 cP, less than 12,000 cP, less than 11,000 cP, or less than 10,000 cP. For example, the composition and/or mixing techniques can be chosen such that the viscosity of the TIM is at least 1,000 cP, such as, for example, at least 2,000 cP, at least 5,000 cP, or at least 10,000 cP. The composition and/or mixing techniques can be chosen such that the viscosity of the TIM is in a range of 1,000 cP to 850,000 cP, such as, for example, 2,000 cP to 750,000 cP, or 2,000 cP to 500,000 cP. The viscosity of the TIM emulsion can be measured by a parallel plate (40 mm) rheometer at 25 degrees Celsius, a frequency of 10 radians per second, and a strain of 5%. Selecting the viscosity can require a balance of installation pressure, which may increase with a high viscosity and an ability to resist undesirably fast spreading during application of the TIM and pump out during operation.

The TIM can comprise at least 1% liquid metal droplets by total volume of the TIM, such as, for example, at least 5% liquid metal droplets, at least 10% liquid metal droplets, at least 20% liquid metal droplets, at least 30% liquid metal droplets, at least 40% liquid metal droplets, at least 50% liquid metal droplets, at least 60% liquid metal droplets, at least 70% liquid metal droplets, at least 80% liquid metal droplets, or at least 90% liquid metal droplets, all based on the total volume of the liquid metal droplets. The TIM can comprise no greater than 95% liquid metal droplets by total volume of the TIM, such as, for example, no greater than 93% liquid metal droplets, no greater than 90% liquid metal droplets, no greater than 80% liquid metal droplets, no greater than 70% liquid metal droplets, no greater than 60% liquid metal droplets, no greater than 50% liquid metal droplets, no greater than 40% liquid metal droplets, no greater than 30% liquid metal droplets, no greater than 20% liquid metal droplets, or no greater than 10% liquid metal droplets, all based on the total volume of the TIM. The TIM can comprise a range of 1% to 95% liquid metal droplets by total volume of the TIM, such as, for example, 5% to 93% liquid metal droplets, 50% to 93% liquid metal droplets, 60% to 93% liquid metal droplets, or 70% to 93% liquid metal droplets, all based on the total volume of the TIM. The amount of liquid metal droplets can be selected while balancing a desired elasticity and a desired effective thermal conductivity of the TIM.

The composition and/or mixing techniques can be selected to achieve a desired $D_{50}$ and/or $D_{90}$ of the liquid metal droplets in the TIM prior to compressing. The $D_{50}$ of the liquid metal droplets can be at least 1 micron prior to compressing, such as, for example, at least 5 microns, at least 10 microns, at least 15 microns, at least 20 microns, at least 30 microns, at least 35 microns, at least 40 microns, at least 50 microns, at least 60 microns, at least 70 microns, at least 80 microns, at least 90 microns, at least 100 microns, at least 120 microns, or at least 150 microns, all prior to compressing. The $D_{50}$ of the liquid metal droplets can be no greater than 200 micron, such as, for example, no greater than 150 microns, no greater than 120 microns, no greater than 100 microns, no greater than 90 microns, no greater than 80 microns, no greater than 70 microns, no greater than 60 microns, no greater than 50 microns, no greater than 40 microns, no greater than 35 microns, no greater than 30 microns, no greater than 20 microns, no greater than 10 microns, or no greater than 5 microns, all prior to compressing. For example, the $D_{50}$ of the liquid metal droplets can be in a range of 1 microns to 200 microns, such as, for example, 5 microns to 150 microns, 15 to 150 microns, 35 microns to 150 microns, 35 microns to 70 microns, or 5 microns to 100 microns, all measured prior to compressing.

As used herein, $D_{50}$ can be measured using microscopy (e.g., optical microscopy or electron microscopy). The size can be the diameter of spherical particles or the length along the largest dimension if ellipsoidal or otherwise irregularly shaped particle. As used herein, "$D_X$" of particles refers to the diameter at which X % of the volume of the particles have a smaller diameter.

The $D_{90}$ of the liquid metal droplets can be at least 1 micron, such as, for example, at least 5 microns, at least 10 microns, at least 15 microns, at least 20 microns, at least 30 microns, at least 35 microns, at least 40 microns, at least 50 microns, at least 60 microns, at least 70 microns, at least 80 microns, at least 90 microns, at least 100 microns, at least 120 microns, or at least 150 microns, all prior to compressing. The $D_{90}$ of the liquid metal droplets can be no greater than 300 micron, such as, for example, no greater than 200 microns, no greater than 150 microns, no greater than 120 microns, no greater than 100 microns, no greater than 90 microns, no greater than 80 microns, no greater than 70 microns, or no greater than 50 microns, all prior to compressing. For example, the $D_{90}$ of the liquid metal droplets can be in a range of 1 microns to 300 microns, such as, for example, 10 microns to 200 microns, 15 to 150 microns, 35 microns to 150 microns, 35 microns to 120 microns, or 50 microns to 100 microns, all measured prior to compressing.

The TIM can optionally comprise other components such as, for example, rigid particles, a catalyst, and coupling agents. The rigid particles can comprise at least one of iron, an iron alloy (e.g., steel), vanadium, a vanadium alloy, niobium, a niobium alloy, titanium, a titanium alloy, copper, a copper alloy (e.g., bronze), a rigid polymer, a glass, and a ceramic. The rigid particles can be resistant to deformation and/or corrosion by the liquid metal droplets. For example, the rigid particles can comprise a Young's modulus of at least 100 MPa (megapascals), such as, for example, at least 110 MPa, at least 150 MPa, at least 200 MPa, at least 250 MPa, at least 500 MPa, at least 750 MPa, at least 1 GPa (gigapascals), or at least 2 GPa. Young's Modulus can be measured according to ASTM E111-17. The TIM can comprise a range of 0.1% to 30% rigid particles by total volume of the TIM, such as, for example, 0.1% to 10% rigid particles, 0.1% to 5% rigid particles, 1% to 10% rigid particles, or 1% to 5% rigid particles, all based on the total volume of the TIM.

The $D_{50}$ of the rigid particles in the TIM can be selected to achieve a desired bondline thickness in the assembly. The average particle size of the rigid particles can be at least 1 micron, such as, for example, at least 5 microns, at least 10 microns, at least 20 microns, at least 30 microns, at least 35 microns, at least 40 microns, at least 50 microns, at least 60 microns, at least 70 microns, at least 80 microns, at least 90 microns, at least 100 microns, at least 120 microns, or at least 125 microns. The $D_{50}$ of the rigid particles can be no greater than 150 microns, such as, for example, no greater than 125 microns, no greater than 120 microns, no greater than 100 microns, no greater than 90 microns, no greater than 80 microns, no greater than 70 microns, no greater than 60 microns, no greater than 50 microns, no greater than 40 microns, no greater than 35 microns, no greater than 30 microns, no greater than 20 microns, no greater than 10 microns, or no greater than 5 microns. For example, the $D_{50}$ of the rigid particles can be in a range of 1 microns to 150 microns, such as, for example, 15 to 150 microns, 5 microns to 125 microns, 35 microns to 125 microns, 35 microns to 70 microns, or 50 microns to 70 microns.

The TIM can be applied to various layers and devices and it is described below with reference to FIGS. 1-2 with reference to a circuit assembly but is not limited to only a circuit assembly and could be applied to other devices. Referring to FIG. 1, the method according to the present disclosure comprises depositing a TIM 104 according to the present disclosure at a first layer thickness, $t_1$, between a first layer 106 of a circuit assembly 102 and a second layer 108 of the circuit assembly 102. The first layer thickness, $t_1$, can be selected to enhance the effective thermal conductivity of the TIM 104 and/or the homogeneity of the TIM 104.

As used in this specification, particularly in connection with layers, films, or materials, the terms "on," "onto," "over," and variants thereof (e.g., "applied on," "formed on," "deposited on," "provided on," "located on," and the like) mean applied, formed, deposited, provided, or otherwise located over a surface of a substrate but not necessarily in contact with the surface of the substrate. For example, a TIM "deposited on" a substrate does not preclude the presence of another layer or other layers of the same or different composition located between the applied TIM and the substrate. Likewise, a second layer "deposited on" a first layer does not preclude the presence of another layer or other layers of the same or different composition located between the deposited second layer and the deposited TIM.

As illustrated, the TIM 104 comprises an emulsion of liquid metal droplets 112 and polymer 110. The first layer thickness, $t_1$, can be at least 1.1 times a $D_{90}$ of the liquid metal droplets 112 prior to compression, such as, for example, at least 2 times $D_{90}$ of the liquid metal droplets 112 prior to compression.

Depositing the TIM 104 can comprise at least one of dispensing, extruding (e.g., through a nozzle, such as, a circular nozzle, a fan nozzle, or other nozzle shape), applying with a utensil (e.g., brush, spatula), stencil printing, 3D printing, and screen printing. The TIM 104 can be deposited in a conformable state such that the TIM 104 can adapt to the surfaces of the first layer 106 and the second layer 108 to achieve a desired level of surface contact therebetween. In various examples, the TIM 104 can be applied directly to the first layer 106 and, thereafter, the second layer 108 can be applied directly to the TIM 104. In various other examples, the TIM 104 can be applied directly to the second layer 108 and, thereafter, the first layer 106 can be applied directly to the TIM 104. In certain examples, the TIM 104 can be applied to both the first layer 106 and the second layer 108 and then the first layer 106 and the second layer 108 can be applied together. In various examples, after deposition of the TIM 104 and compression of the circuit assembly 102, the TIM 104 can be in direct contact with the first layer 106 and the second layer 108. In certain examples, the application of the TIM 104 may be limited to the surfaces of the first layer 106 such that the TIM 104 can be efficiently used.

The TIM 104 can be dispensed from a container and applied to a layer in a conformable state. The TIM 104 can be stored in a container prior to use. The TIM 104 can be in a conformable state in the container. The container can comprise at least one of a pillow pack, a syringe, a beaker, a jar, a bottle, and a drum. In various examples, the container can be a ready to use dispensing device, such as, for example, a pillow pack or a syringe. In certain examples, the TIM 104 may not be stored and can be used after formation without storage.

The first layer 106 can be a heat-generating electronic component (e.g., integrated circuit, such as, a processor, an ASIC, and/or a system-on-a-chip (SOC)) and/or thermally connected to the heat-generating electronic component. The second layer 108 can be an upper layer that can be thermally conductive. The first layer 106 and the second layer 108, individually, can be at least one of a heat sink (e.g., fins, fan, liquid cooling), an integrated heat spreader, a die, and packaging. For example, the first layer 106 can comprise a die and the second layer 108 can comprise an integrated heat sink.

After deposition of the TIM 104, the method can comprise compressing the circuit assembly 102 to decrease the first layer thickness, $t_1$, to a second layer thickness, $t_2$, thereby deforming the liquid metal droplets 112 and forming an integrated circuit 202. For example, referring to the detailed views in FIGS. 1-2, the first layer 106 and the second layer 108 can be urged together. For example, compressing the circuit assembly 102 can comprise applying a first pressure to the first layer 106 and the second layer 108 of at least 1 psig, such as, for example, at least 5 psig, at least 10 psig, at least 15 psig, or at least 20 psig. The first pressure can be no greater than 100 psig.

In various examples, the relative liquid metal surface area coverage between the TIM 104, and the first layer 106 and the second layer 108 can be increased by compression. For example, the relative liquid metal surface area coverage after compression can be in a range of 1% to 100%, such as, for example, 1% to 5%, 5% to 10%, 10% to 30%, 30% to 50%, or increasing until the liquid metal surface area coverage achieves 100%. As used herein, "relative liquid metal area coverage" is the surface area covered by the liquid metal normalized by the total contact surface area between the TIM 104 and the first layer 106 and second layer 108. Relative liquid metal area coverage can be measured using cross-sectioning followed by optical imaging using a ZEISS Axio Zoom. V16 or confocal scanning acoustic microscopy using a Hitachi FineSAT III for CSAM.

The second layer thickness, $t_2$, can be the bondline thickness and the second layer thickness, $t_2$, can be no greater than 200 microns, such as, for example, no greater than 150 microns, no greater than 145 microns, no greater than 140 microns, no greater than 125 microns, no greater than 100 microns, no greater than 80 microns, no greater than 70 microns, no greater than 50 microns, no greater than 40 microns, no greater than 35 microns, or no greater than 30 microns. The second layer thickness, $t_2$, can be at least 1 microns, such as, for example, at least 15 microns, at least 30 microns, at least 35 microns, at least 40 microns, at least 50 microns, at least 70 microns, at least 75 microns, at least 80 microns, at least 100 microns, at least 120 microns, at least 140 microns, or at least 145 microns. The second layer thickness, $t_2$, can be in a range of 1 microns to 200 microns, such as, for example, 15 microns to 200 microns, 15 microns to 150 microns, 30 microns to 150 microns, 50 microns to 120 microns, 75 microns to 125 microns, or 15 microns to 100 microns.

Compressing the circuit assembly 102 can apply a force to the TIM 104 and can deform the liquid metal droplets 112 dispersed within the polymer 110 of the TIM 104. Because the polymer 110 is still conformable and moveable, the compressing force can deform the liquid metal droplets 112. The liquid metal droplets 112 can be in the liquid phase during deformation such that a lower pressure is required for the compression and a desired deformation is achieved. For example, the liquid metal droplets 112 can be generally spherical as shown in FIG. 1 and thereafter can be generally ellipsoidal as shown in FIG. 2. In various examples, the liquid metal droplets 112 prior to compressing can have a first average aspect ratio and after compressing the liquid metal droplets 112 can have a second average aspect ratio. The second average aspect ratio can be different that the first average aspect ratio. For example, the second average aspect ratio can be greater than the first average aspect ratio. The average aspect ratio can be a mean ratios of the width of the liquid metal droplets 112 to the height of the liquid metal droplets 112. In various examples, the first aspect ratio can be 1 and the second aspect ratio can be greater than 1. In certain embodiments, the first aspect ratio can be in a range of 1 to 1.5. In certain embodiments, the second aspect ratio can be at least 0.5 greater than the first aspect ratio, such as, for example, at least 1 greater than the first aspect ratio, at least 2 greater than the first aspect ratio, or at least 5 greater than the first aspect ratio. In certain embodiments, the second aspect ratio can be at least 2 after compressing the circuit assembly 102, such as, for example, at least 3, at least 4, at least 5, at least 6, or at least 10 after compressing the circuit assembly 102.

The width (e.g., longest dimension) of the liquid metal droplets 112 can be substantially aligned with the longitudinal plane of the TIM 104 in the circuit assembly 102 and the height of the liquid metal droplets 112 can be substantially aligned with the thickness of the TIM 104 (e.g., the thickness, $t_2$). The width of the liquid metal droplets 112 can increase upon compression of the circuit assembly 102. For example, in certain examples, the diameter of liquid metal droplets prior to compressing can be 200 μm (with a first aspect ratio of 1) and after compression to a bondline thickness of 100 μm, the liquid metal drop can be deformed to an ellipsoidal shape with a 400 μm width (e.g., second aspect ratio of 4).

Figure 2:
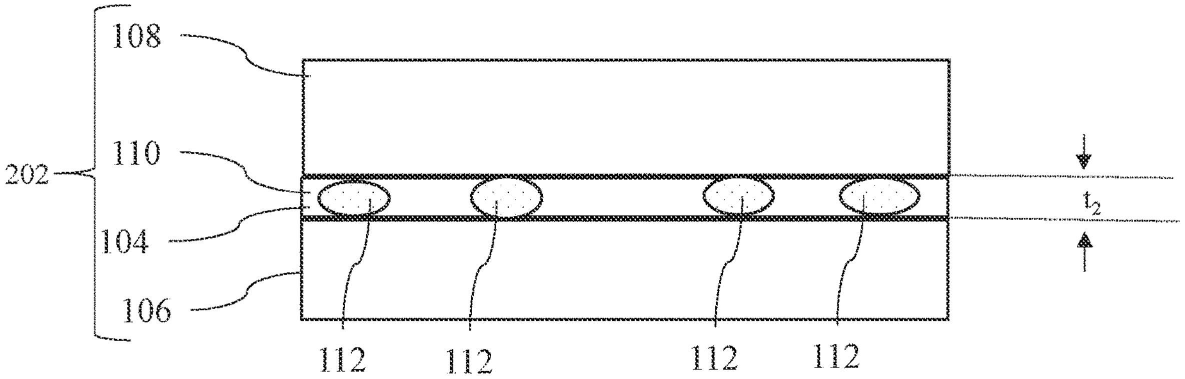
FIG. 2 is a side view of an integrated circuit formed by compressing the circuit assembly of FIG. 1.

In certain examples, the liquid metal droplets 112 can be aligned substantially in a monolayer as shown in FIG. 2 after compressing. The monolayer can be achieved by selecting the $D_{50}$ and/or $D_{90}$ of the liquid metal droplets 112, the second thickness, $t_2$, and depositing with the first layer thickness, $t_1$. Configuring the liquid metal droplets 112 in a monolayer can reduce the thermal resistance of the TIM 104.

The $D_{50}$ and/or $D_{90}$ of the liquid metal droplets 112, deformation of the liquid metal droplets 112, and the method of deposition of the liquid metal droplets 112 can improve the thermal resistance value of the TIM 104. For example, the TIM 104 can comprise a thermal resistance value of at least 5 (° K*mm$^2$)/W, such as, for example, at least 1 (° K*mm$^2$)/W, at least 2 (° K*mm$^2$)/W, at least 3 (° K*mm$^2$)/W, at least 5 (° K*mm$^2$)/W, or at least 10 (° K*mm$^2$)/W. The TIM 104 can comprise a thermal resistance value of no greater than 30 (° K*mm$^2$)/W, such as, for example, no greater than 20 (° K*mm$^2$)/W, no greater than 15 (° K*mm$^2$)/W, no greater than 10 (° K*mm$^2$)/W, no greater than 9 (° K*mm$^2$)/W, no greater than 8 (° K*mm$^2$)/W, no greater than 7 (° K*mm$^2$)/W, or no greater than 5 (° K*mm$^2$)/W. The TIM 104 can comprise a thermal resistance value in a range of 0.5 (° K*mm$^2$)/W to 30 (° K*mm$^2$)/W, such as, for example, 0.5 (° K*mm$^2$)/W to 20 (° K*mm$^2$)/W, 0.5 (° K*mm$^2$)/W to 15 (° K*mm$^2$)/W, 1 (° K*mm$^2$)/W to 10 (° K*mm$^2$)/W, 2 (° K*mm$^2$)/W to 10 (° K*mm$^2$)/W, or 2 (° K*mm$^2$)/W to 8 (° K*mm$^2$)/W. The thermal resistance value can be measured using a TIMA 5 instrument from NanoTest (Germany).

The $D_{50}$ and/or $D_{90}$ of the liquid metal droplets 112, deformation of the liquid metal droplets 112, and the method of deposition of the liquid metal droplets 112 can improve the thermal conductivity value of the TIM 104. For example, the TIM 104 can comprise an effective thermal conductivity value of at least 5 W/m*K, such as, for example, at least 10 W/m*K, at least 12 W/m*K, at least 15 W/m*K, at least 17 W/m*K, or at least 20 W/m*K. The TIM can comprise an effective thermal conductivity value in a range of 5 W/m*K to 50 W/m*K, such as, for example, 10 W/m*K to 40 W/m*K or 10 W/m*K to 30 W/m*K. As used herein, the effective thermal conductivity is a thickness of the TIM divided by a thermal resistance of the TIM.

The TIM 104 can be cured or may not be cured depending on the application. For example, the TIM 104 may be cured to solid or the TIM may be a paste. Curing the TIM 104 can increase the viscosity of the polymer 110 and can harden the polymer 110. For example, the polymer 110 can become a solid. In various examples, the polymer 110 after curing is elastomeric. Curing the polymer 110 can inhibit pump out of the liquid metal droplets 112 during thermal cycling of the circuit assembly 102 and can provide a mechanical bond between the first layer 106 and the second layer 108.

Curing the TIM 104 can comprise at least one of heating the TIM 104 (e.g., in examples with a thermosetting polymer), adding a catalyst to the TIM 104, exposing the TIM 104 to air, cooling the TIM 104 (e.g., in examples with a thermoplastic polymer), applying electromagnetic radiation (e.g., photo-polymerization), and applying pressure to the TIM 104.

For example, the TIM can be cured by heating the TIM to a temperature of at least 70 degrees Celsius, such as, for example, at least 80 degrees Celsius, at least 90 degrees Celsius, at least 100 degrees Celsius, at least 110 degrees Celsius, or at least 120 degrees Celsius. The TIM can be cured by heating the TIM to a temperature of no greater than 200 degrees Celsius, such as, for example, no greater than 150 degrees Celsius. The TIM can be cured by heating the TIM to a temperature in a range of 70 degrees Celsius to 200 degrees Celsius, such as, for example, 100 degrees Celsius to 150 degrees Celsius.

The TIM can be cured while applying pressure to the TIM, such as, for example, a pressure of at least 10 psig, at least 15 psig, or at least 20 psig. The pressure may be no greater than 100 psig. The curing can comprise snap curing.

The thermal interface material can comprise a weight loss of 0.5% by weight or less after curing (at 175 degrees Celsius, with a one hour hold time, with a 30 degrees Celsius per minute temperature ramp), such as, for example, 0.1% by weight or less after curing (at 175 degrees Celsius, with a one hour hold time, with a 30 degrees Celsius per minute temperature ramp), or 0.05% by weight or less after curing (at 175 degrees Celsius, with a one hour hold time, with a 30 degrees Celsius per minute temperature ramp). In various examples, the thermal interface material is substantially free of voids after curing. For example, distilling the first polymer can decrease the amount and/or size of voids measured from a glass voiding test. The glass voiding test includes forming a sample by placing TIM between two glass slides and using spacers to control a first distance therebetween. Pressure is applied to the glass slides to compress the TIM to a thickness substantially equal to the first distance. Then, the sample is put into an oven to cure while a pressure is still applied to the glass slides. The oven can be at a temperature in a range of 80 degrees Celsius to 150 degrees Celsius and the glass slides and time can remain in the oven for a time period in a range of 5 minutes to 120 minutes. The sample is removed from the oven and cooled. Then, the surface of the TIM is inspected with an optical microscope to determine the presence, quantity, and size of voids. A void is an empty space of at least 50 microns in diameter.

Curing the TIM 104 can increase the viscosity of the TIM to greater than 15,000 cP, such as, for example, greater than 20,000 cP, greater than 30,000 cP, greater than 50,000 cP, greater than 100,000 cP, greater than 150,000 cP, greater than 200,000 cP, greater than 250,000 cP, greater than 500,000 cP, greater than 750,000 cP, or greater than 850,000 cP. For example, the polymer in the TIM 104 can be cured. In various examples, the TIM 104 can be an adhesive. The polymer in the TIM 104 can be selected to reduce off-gassing of the TIM 104 during curing.

As used in this specification, the terms "cure" and "curing" refer to the chemical cross-linking of components in an emulsion or material applied over a substrate or the increase of viscosity of the components in the emulsion or material applied over the substrate. Accordingly, the terms "cure" and "curing" do not encompass solely physical drying of an emulsion or material through solvent or carrier evaporation.

In this regard, the term "cured," as used in this specification in examples comprising a thermosetting polymer, refers to the condition of an emulsion or material in which a component of the emulsion or material has chemically reacted to form new covalent bonds in the emulsion or material (e.g., new covalent bonds formed between a binder resin and a curing agent). The term "cured", as used in this specification in examples comprising a thermoplastic polymer, refers to the condition of an emulsion or material in which the temperature of the thermoplastic polymer decreases below the melting point of the thermoplastic polymer such that the viscosity of the emulsion or material increases. In examples comprises both a thermosetting polymer and a thermoplastic polymer, the term "cured" refers to one of or both of the polymers curing as described herein.

In various other examples, the TIM according to the present disclosure can be used in a system on a package. For example, a single horizontal TIM layer can be in contact with multiple dies on one side (e.g., the integrated circuit can comprise multiple dies or multiple integrated circuits can be in contact with the same side of the TIM) and an upper layer or layers on a different side.

Those skilled in the art will recognize that the herein described compositions, thermal interface materials, circuit assemblies, methods, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

With respect to the appended claims, those skilled in the art will appreciate that recited operations therein may generally be performed in any order. Also, although various operational flows are presented in a sequence(s), it should be understood that the various operations may be performed in other orders than those that are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although various examples have been described herein, many modifications, variations, substitutions, changes, and equivalents to those examples may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed examples. The following claims are intended to cover all such modification and variations.

Various aspects of the invention according to the present disclosure include, but are not limited to, the aspects listed in the following numbered clauses.

Clause 1. A method of manufacture of a thermal interface material, the method comprising: distilling a first polymer component to form a distilled polymer component, wherein the first polymer component comprises a first concentration of volatile organic compounds and the distilled polymer component comprises a second concentration of volatile organic compounds, wherein the second concentration is at least 0.1% by weight less than the first concentration, and mixing the distilled polymer component with liquid metal to form a thermal interface material such that liquid metal droplets are dispersed throughout the distilled polymer component.

Clause 2. The method of clause 1, wherein the second concentration is at least 0.5% by weight less than the first concentration.

Clause 3. The method of any of clauses 1-2, wherein the distilling comprises heating the first polymer component to a temperature of at least 100 degrees Celsius and subjecting the first polymer component to a pressure of less than 100 mbar absolute.

Clause 4. The method of any of clauses 1-3, wherein the distilling comprises short path vacuum distillation.

Clause 5. The method of any of clauses 1-4, wherein the distilling comprises rotary distillation.

Clause 6. The method of any of clauses 1-5, wherein the distilling comprises short path vacuum distillation including a heated condenser.

Clause 7. The method of any of clauses 1-6, wherein the first concentration is in a range of 2% by weight to 5% by weight based on a total weight of the first polymer component and the second concentration is no greater than 1% by weight based on a total weight of the distilled polymer component.

Clause 8. The method of any of clauses 1-7, wherein the distilled polymer component has a weight loss of 0.5% by weight or less as measured using a thermogravimetric analyzer at 175 degrees Celsius, with a one hour hold time, with a 30 degrees Celsius per minute temperature ramp under a nitrogen gas purge.

Clause 9. The method of any of clauses 1-8, wherein the first polymer component comprises a first average molecular weight and the distilled polymer component comprises a second average molecular weight, wherein the second average molecular weight is greater than the first average molecular weight.

Clause 10. The method of any of clauses 1-9, wherein the liquid metal droplets comprise at least one of gallium, a gallium alloy, indium, an indium alloy, tin, a tin alloy, mercury, and a mercury alloy.

Clause 11. The method of any of clauses 1-10, wherein the liquid metal droplets comprise a melting point no greater than 30 degrees Celsius.

Clause 12. The method of any of clauses 1-11, wherein a $D_{50}$ of the liquid metal droplets in the thermal interface material is in a range of 1 microns to 200 microns.

Clause 13. The method of any of clauses 1-13, wherein the thermal interface material comprises a range of 1% to 95% liquid metal droplets by total volume of the thermal interface material.

Clause 14. The method of any of clauses 1-13, wherein the thermal interface material has a viscosity in a range of 1,000 cP to 850,000 cP prior to compressing as measured at 25 degrees Celsius.

Clause 15. The method of any of clauses 1-14, wherein the first polymer component comprises a polymeric binder.

Clause 16. The method of any of clauses 1-15, wherein the first polymer component comprises a thermosetting polymer.

Clause 17. The method of any of clauses 1-16, wherein the first polymer component comprises a thermoplastic polymer.

Clause 18. The method of any of clauses 1-17, wherein the first polymer component comprises a cross-linking agent and the method further comprises mixing the distilled polymer component with a second polymer component comprising a monomer.

Clause 19. The method of clause 18, wherein the cross-linking agent comprises a silane cross-linking agent and the monomer comprises a silicone monomer.

Clause 20. The method of any of clauses 1-19, wherein the thermal interface material further comprises an additive selected from the group consisting of rigid particles, a catalyst, and a coupling agent.

Clause 21. The method of any of clauses 1-20, further comprising mixing the distilled polymer component and a second polymer component, wherein the distilled polymer component comprises a first viscosity as measured at 25 degrees Celsius and the second polymer component comprises a second viscosity as measured at 25 degrees Celsius, wherein the first viscosity is greater than the second viscosity.

Clause 22. The method of any of clauses 1-21, wherein the mixing comprises centrifugal mixing.

Clause 23. The method of any of clauses 1-22, wherein the mixing comprises shear mixing.

Clause 24. A thermal interface material produced by the method of any of clauses 1-23.

Clause 25. A method of manufacture of a cured circuit assembly, the method comprising: applying the thermal interface material of claim 1 on a first layer of a circuit assembly, such that the thermal interface material is between the first layer and a second layer of the circuit assembly, compressing the circuit assembly thereby deforming the liquid metal droplets; and curing the thermal interface material thereby forming a cured assembly.

Clause 26. The method of clause 25, wherein the curing is performed under a pressure of at least 10 psi gauge.

Clause 27. The method of any of clauses 25-26, wherein the curing is snap curing.

Clause 28. The method of any of clauses 25-27, wherein the curing is performed at a temperature of at least 100 degrees Celsius.

Clause 29. The method of any of clauses 25-28, wherein the thermal interface material has a weight loss of 0.5% by weight or less after curing.

Clause 30. The method of any of clauses 25-29, wherein the thermal interface material has a weight loss of 0.1% by weight or less after curing.

Clause 31. The method of any of clauses 25-30, wherein the thermal interface material is substantially free of voids after curing.

Clause 32. The method of any of clauses 25-31, wherein a bondline distance formed between the first layer and the second layer in the cured assembly is no greater than 150 microns.

Clause 33. The method of any of clauses 25-32, wherein a $D_{90}$ of the liquid metal droplets in the thermal interface material prior to applying is greater than a bondline distance formed between the first layer and the second layer in the cured assembly.

Clause 34. The method of any of clauses 25-33, wherein the thermal interface material after curing comprises a thermal resistance value of no greater than 20 (° $K*mm^2$)/W.

Clause 35. The method of any of clauses 25-34, wherein the liquid metal droplets comprise an aspect ratio of at least 2 after compressing the circuit assembly.

Clause 36. An integrated circuit assembly produced by the method of any of clauses 25-35.

As used herein, "at least one of" a list of elements means one of the elements or any combination of two or more of the listed elements. As an example "at least of A, B, and C" means A only; B only; C only; A and B; A and C; B and C; or A, B, and C.

Various features and characteristics are described in this specification to provide an understanding of the composition, structure, production, function, and/or operation of the invention, which includes the disclosed compositions, coatings, and methods. It is understood that the various features and characteristics of the invention described in this specification can be combined in any suitable manner, regardless of whether such features and characteristics are expressly described in combination in this specification. The Inventors and the Applicant expressly intend such combinations of features and characteristics to be included within the scope of the invention described in this specification. As such, the claims can be amended to recite, in any combination, any features and characteristics expressly or inherently described in, or otherwise expressly or inherently supported by, this specification. Furthermore, the Applicant reserves the right to amend the claims to affirmatively disclaim features and characteristics that may be present in the prior art, even if those features and characteristics are not expressly described in this specification. Therefore, any such amendments will not add new matter to the specification or claims and will comply with the written description, sufficiency of description, and added matter requirements.

Any numerical range recited in this specification describes all sub-ranges of the same numerical precision (i.e., having the same number of specified digits) subsumed within the recited range. For example, a recited range of "1.0 to 10.0" describes all sub-ranges between (and including) the recited minimum value of 1.0 and the recited maximum value of 10.0, such as, for example, "2.4 to 7.6," even if the range of "2.4 to 7.6" is not expressly recited in the text of the specification. Accordingly, the Applicant reserves the right to amend this specification, including the claims, to expressly recite any sub-range of the same numerical precision subsumed within the ranges expressly recited in this specification. All such ranges are inherently described in this specification such that amending to expressly recite any such sub-ranges will comply with the written description, sufficiency of description, and added matter requirements.

Also, unless expressly specified or otherwise required by context, all numerical parameters described in this specification (such as those expressing values, ranges, amounts, percentages, and the like) may be read as if prefaced by the word "about," even if the word "about" does not expressly appear before a number. Additionally, numerical parameters described in this specification should be construed in light of the number of reported significant digits, numerical precision, and by applying ordinary rounding techniques. It is also understood that numerical parameters described in this specification will necessarily possess the inherent variability characteristic of the underlying measurement techniques used to determine the numerical value of the parameters.

Notwithstanding that numerical ranges and parameters setting forth the broad scope of the invention are approximations, numerical values set forth in the specific examples are reported precisely as possible. Any numerical value, however, inherently contains certain errors necessarily resulting from the standard variation found in its respective testing measurements.

Reference throughout the specification to "various examples," "some examples," "one example," "an example," or the like means that a particular feature, structure, or characteristic described in connection with the example is included in an example. Thus, appearances of the phrases "in various examples," "in some examples," "in one example," "in an example," or the like, in places throughout the specification are not necessarily all referring to the same example. Furthermore, the particular features, structures, or characteristics may be combined in any suitable manner in an example or examples. Thus, the particular features, structures, or characteristics illustrated or described in connection with one example may be combined, in whole or in part, with the features, structures, or characteristics of another example or other examples without limitation. Such modifications and variations are intended to be included within the scope of the present examples.

Any patent, publication, or other document identified in this specification is incorporated by reference into this specification in its entirety unless otherwise indicated but only to the extent that the incorporated material does not conflict with existing descriptions, definitions, statements, illustrations, or other disclosure material expressly set forth in this specification. As such, and to the extent necessary, the express disclosure as set forth in this specification supersedes any conflicting material incorporated by reference. Any material, or portion thereof, that is incorporated by reference into this specification, but which conflicts with existing definitions, statements, or other disclosure material set forth herein, is only incorporated to the extent that no conflict arises between that incorporated material and the existing disclosure material. Applicant reserves the right to amend this specification to expressly recite any subject matter, or portion thereof, incorporated by reference. The amendment of this specification to add such incorporated subject matter will comply with the written description, sufficiency of description, and added matter requirements.

Whereas particular examples of this invention have been described above for purposes of illustration, it will be evident to those skilled in the art that numerous variations of the details of the present invention may be made without departing from the invention as defined in the appended claims.

While the present disclosure provides descriptions of various specific aspects for the purpose of illustrating various aspects of the present disclosure and/or its potential applications, it is understood that variations and modifications will occur to those skilled in the art. Accordingly, the invention or inventions described herein should be understood to be at least as broad as they are claimed and not as more narrowly defined by particular illustrative aspects provided herein.

It is understood that the inventions described in this specification are not limited to the examples summarized in the Summary or Detailed Description. Various other aspects are described and exemplified herein.

What is claimed is:

1. A method of manufacture of a thermal interface material, the method comprising:

distilling a first polymer component to form a distilled polymer component, wherein the first polymer component comprises a first concentration of volatile organic compounds and the distilled polymer component comprises a second concentration of volatile organic compounds, wherein the second concentration is at least 0.1% by weight less than the first concentration; and mixing the distilled polymer component with liquid metal to form a thermal interface material such that liquid metal droplets are formed from the liquid metal and are dispersed throughout the distilled polymer component.

2. The method of claim 1, wherein the second concentration is at least 0.5% by weight less than the first concentration.

3. The method of claim 1, wherein the distilling comprises heating the first polymer component to a temperature of at least 100 degrees Celsius and subjecting the first polymer component to a pressure of less than 100 mbar absolute.

4. The method of claim 1, wherein the distilling comprises short path vacuum distillation.

5. The method of claim 1, wherein the distilling comprises rotary distillation.

6. The method of claim 1, wherein the distilling comprises short path vacuum distillation including a heated condenser.

7. The method of claim 1, wherein the first concentration is in a range of 2% by weight to 5% by weight based on a total weight of the first polymer component and the second concentration is no greater than 1% by weight based on a total weight of the distilled polymer component.

8. The method of claim 1, wherein the distilled polymer component has a weight loss of 0.5% by weight or less as measured using a thermogravimetric analyzer at 175 degrees Celsius, with a one hour hold time, with a 30 degrees Celsius per minute temperature ramp under a nitrogen gas purge.

9. The method of claim 1, wherein the first polymer component comprises a first average molecular weight and the distilled polymer component comprises a second average molecular weight, wherein the second average molecular weight is greater than the first average molecular weight.

10. The method of claim 1, wherein the liquid metal droplets comprise at least one of gallium, a gallium alloy, indium, an indium alloy, tin, a tin alloy, mercury, and a mercury alloy.

11. The method of claim 1, wherein the liquid metal droplets comprise a melting point no greater than 30 degrees Celsius.

12. The method of claim 1, wherein a $D_{50}$ of the liquid metal droplets in the thermal interface material is in a range of 1 microns to 200 microns.

13. The method of claim 1, wherein the thermal interface material comprises a range of 1% to 95% liquid metal droplets by total volume of the thermal interface material.

14. The method of claim 1, wherein the thermal interface material has a viscosity in a range of 1,000 cP to 850,000 cP prior to compressing as measured at 25 degrees Celsius.

15. The method of claim 1, wherein the first polymer component comprises a polymeric binder.

16. The method of claim 1, wherein the first polymer component comprises a thermosetting polymer.

17. The method of claim 1, wherein the first polymer component comprises a thermoplastic polymer.

18. The method of claim 1, wherein the first polymer component comprises a cross-linking agent and the method further comprises mixing the distilled polymer component with a second polymer component comprising a monomer.

19. The method of claim 18, wherein the cross-linking agent comprises a silane cross-linking agent and the monomer comprises a silicone monomer.

20. The method of claim 1, wherein the thermal interface material further comprises an additive selected from the group consisting of rigid particles, a catalyst, and a coupling agent.

21. The method of claim 1, further comprising mixing the distilled polymer component and a second polymer component, wherein the distilled polymer component comprises a first viscosity as measured at 25 degrees Celsius and the second polymer component comprises a second viscosity as measured at 25 degrees Celsius, wherein the first viscosity is greater than the second viscosity.

22. The method of claim 1, wherein the mixing comprises centrifugal mixing.

23. The method of claim 1, wherein the mixing comprises shear mixing.

24. A thermal interface material produced by the method of claim 1.

25. A method of manufacture of a cured circuit assembly, the method comprising:

applying the thermal interface material of claim 1 on a first layer of a circuit assembly, such that the thermal interface material is between the first layer and a second layer of the circuit assembly;

compressing the circuit assembly thereby deforming the liquid metal droplets; and curing the thermal interface material thereby forming a cured assembly.

26. The method of claim 25, wherein the curing is performed under a pressure of at least 10 psi gauge.

27. The method of claim 25, wherein the curing is snap curing.

28. The method of claim 25, wherein the curing is performed at a temperature of at least 100 degrees Celsius.

29. The method of claim 25, wherein the thermal interface material has a weight loss of 0.5% by weight or less after curing.

30. The method of claim 25, wherein the thermal interface material has a weight loss of 0.1% by weight or less after curing.

31. The method of claim 25, wherein the thermal interface material is substantially free of voids after curing.

32. The method of claim 25, wherein a bondline distance formed between the first layer and the second layer in the cured assembly is no greater than 150 microns.

33. The method of claim 25, wherein a $D_{90}$ of the liquid metal droplets in the thermal interface material prior to applying is greater than a bondline distance formed between the first layer and the second layer in the cured assembly.

34. The method of claim 25, wherein the thermal interface material after curing comprises a thermal resistance value of no greater than 20 (° K*mm$^2$)/W.

35. The method of claim 25, wherein the liquid metal droplets comprise an aspect ratio of at least 2 after compressing the circuit assembly.

36. An integrated circuit assembly produced by the method of claim 25.

* * * * *